United States Patent
Vogt et al.

(10) Patent No.: US 7,611,279 B2
(45) Date of Patent: Nov. 3, 2009

(54) TEMPERATURE SENSOR PROVIDING A TEMPERATURE SIGNAL IN DIGITAL FORM

(75) Inventors: Lionel Vogt, Orvault (FR); Youness Chara, Casablanca (MA)

(73) Assignee: STMicroelectronics Maroc, Casablanca ( * ) Notice: Subject to any disclaimer, the term of this patent is extended or adjusted under 35 U.S.C. 154(b) by 245 days.

(21) Appl. No.: 11/894,303

(22) Filed: Aug. 20, 2007

(65) Prior Publication Data

US 2008/0043810 A1    Feb. 21, 2008

(51) Int. Cl.
*G01K 7/16*    (2006.01)
*H03K 3/00*    (2006.01)

(52) U.S. Cl. .................. 374/170; 374/100; 374/183

(58) Field of Classification Search ................. 374/183, 374/1, 170, 100
See application file for complete search history.

(56) References Cited

U.S. PATENT DOCUMENTS

| | | | | |
|---|---|---|---|---|
| 3,266,316 | A * | 8/1966 | Jones et al. | 374/170 |
| 4,110,746 | A * | 8/1978 | Furukawa et al. | 341/140 |
| 4,448,546 | A * | 5/1984 | Paros | 374/117 |
| 5,241,310 | A | 8/1993 | Tiemann | |
| 6,215,635 | B1 * | 4/2001 | Nguyen | 361/103 |
| 6,695,475 | B2 * | 2/2004 | Yin | 374/171 |
| 7,029,171 | B2 * | 4/2006 | Tesi et al. | 374/1 |
| 7,497,615 | B2 * | 3/2009 | Kim et al. | 374/170 |
| 2002/0105449 | A1 | 8/2002 | Schreier et al. | |
| 2002/0147564 | A1 * | 10/2002 | Lamb et al. | 702/132 |
| 2004/0071183 | A1 * | 4/2004 | Tesi et al. | 374/1 |
| 2004/0227651 | A1 | 11/2004 | Furuichi | |
| 2006/0018364 | A1 * | 1/2006 | Kim et al. | 374/183 |

FOREIGN PATENT DOCUMENTS

DE    10 2004 030812 A1    9/2005

OTHER PUBLICATIONS

French Search Report for FR 0653397 dated Feb. 12, 2007.

\* cited by examiner

*Primary Examiner*—Andre J Allen
(74) *Attorney, Agent, or Firm*—Kevin D. Jablonski; Graybeal Jackson LLP

(57) ABSTRACT

An embodiment of a temperature sensor providing a digital signal representative of temperature comprises a measurement unit providing a first measurement current equal to the sum of at least a first current proportional to temperature and of a second current; a comparator capable of providing a comparison signal which depends on the comparison between the first current and the difference between a third current and the second current; a coding unit receiving the comparison signal and providing said digital signal; a digital-to-analog converter capable of providing the second current and the third current, said difference corresponding to the conversion of said digital signal; and a unit for providing a reference voltage.

28 Claims, 2 Drawing Sheets

TEMPERATURE SENSOR PROVIDING A TEMPERATURE SIGNAL IN DIGITAL FORM

PRIORITY CLAIM

This application claims priority from French patent application No. 06/53397, filed Aug. 18, 2006, which is incorporated herein by reference.

TECHNICAL FIELD

An embodiment of the present invention relates to a temperature sensor providing a signal representative of the temperature in digital form.

BACKGROUND

There currently is a tendency to manufacture integrated circuits performing more and more complex functions, in ever-increasing numbers. This results in an increase in the heat dissipated in the integrated circuit. For reasons of performance and reliability, it is often necessary to provide a device for controlling the integrated circuit temperature to maintain the circuit within an acceptable temperature range. The control device generally comprises a temperature sensor made in integrated fashion.

The temperature sensor typically must comply with several constraints:
- it typically must provide a signal representative of the integrated circuit temperature in a readily-usable digital form;
- it typically must provide a signal representative of temperature with a sufficient accuracy;
- it typically must operate properly in a noisy digital environment;
- the sensor setting, or calibration, typically must be simple; and
- the sensor manufacturing method typically must be compatible with CMOS manufacturing processes.

To comply with such constraints, different temperature sensor circuits have been provided.

FIG. 1 schematically shows a conventional embodiment of a temperature sensor 10 providing a signal representative of temperature in digital form.

Sensor 10 comprises a temperature-measurement unit 12 (TEMP. SENSOR) providing an analog signal $S_T$ representative of temperature. An amplifier 14 (A) receives signal $S_T$ and provides an amplified signal $AS_T$. An analog-to-digital converter 16 (A.D.C) converts signal $AS_T$ into a digital signal Code, coded over N bits, representative of temperature. The operation of converter 16 generally requires a constant reference signal $S_{REF}$ provided by a reference signal generation unit 18 (REF.GEN).

Typically, signal $S_T$ corresponds to a voltage varying between 45 and 75 mV, respectively for −40° C. and +125° C., which represents a 30-mV variation. Most analog-to-digital converters require for the analog voltages which are provided thereto to be within a range from 0 to 1 V. It thus may be necessary for amplifier 14 to have a high and accurate amplification factor. Indeed, an inaccuracy at the level of amplifier 14 would translate as a significant inaccuracy of the provided digital signal Code. Further, amplified though it may be, signal $AS_T$ keeps a limited slope, typically on the order of 5 mV/K. The forming of analog-to-digital converter 16 can then be critical. Indeed, if it is desired for the least significant bit of signal Code to represent 1 K, a 5-mV variation of signal $AS_T$ must be translated by it. The forming of an amplifier 14 and of an analog-to-digital converter 16 of high accuracy typically translates as the obtaining of a temperature sensor 10 taking up a large surface area of the integrated circuit and having a high power consumption.

SUMMARY OF THE INVENTION

An embodiment of the present invention is a temperature sensor providing a signal representative of temperature in digital form which can be made in integrated fashion, taking up a decreased surface area and having a limited power consumption.

According to another embodiment of the present invention, the resolution of the temperature sensor can easily be modified.

According to another embodiment of the present invention, the parameterizing of the temperature sensor can be made in simple fashion.

An embodiment of the present invention provides a temperature sensor providing a digital signal representative of temperature, comprising a measurement unit providing a first measurement current equal to the sum of at least a first current proportional to temperature and of a second current; a comparator capable of providing a comparison signal which depends on the comparison between the first current and the difference between a third current and the second current; a coding unit receiving the comparison signal and providing said digital signal; a current-switching digital-to-analog converter capable of providing the second current to a first output terminal and the third current to a second output terminal, said difference corresponding to the conversion of said digital signal, the measurement unit being connected to the first output terminal; and a unit for providing a reference voltage to the first and second output terminals having a value distinct from the sensor ground voltage.

According to an embodiment of the present invention, the sensor comprises a unit for providing said reference voltage to the first output terminal and a unit capable of applying the reference voltage to the second output terminal.

According to an embodiment of the present invention, the sensor comprises a first operational amplifier having a first input connected to the first output terminal and a second input connected to the second output terminal, and a resistor connecting the second input and the output of the first operational amplifier, the comparator comprising a second operational amplifier having third and fourth inputs, the voltages across the resistor being applied between the third and fourth inputs of the second operational amplifier.

According to an embodiment of the present invention, the digital signal comprises an integral number N of bits of ranks 0 to N−1, the bit of rank N−1 being the most significant, and the digital-to-analog converter is a ladder network comprising N successive cells, each comprising an input node, an intermediary node, and an output node; a first resistor at a first resistance value between the input node and the intermediary node; a second resistor at a second resistance value between the intermediary node and the output node, the output node of a cell of rank i, where i is an integer ranging between 0 and N−2, being connected to the intermediary node of the cell of rank i+1; and a switch capable of connecting the input node to the first output terminal or to the second output terminal according to the value of the bit of rank i of said digital signal; the output node of the cell of rank N−1 is connected to the sensor ground, a third resistor at the first resistance value connecting the intermediary node of the cell of rank 0 to the second output terminal.

According to an embodiment of the present invention, the sensor further comprises a fourth resistor connecting the output node of the cell of rank N−1 to the second output terminal.

According to an embodiment of the present invention, the unit for providing the reference voltage comprises first and second bipolar transistors having their bases and collectors connected to the sensor ground; an operational amplifier having a first input connected to the first output terminal via a first resistor and to the emitter of the first transistor and a second input connected to the first output terminal via a second resistor and to the emitter of the second transistor via a third resistor, said operational amplifier providing a control voltage; and a current source controlled by the control voltage and connected to the first output terminal.

According to an embodiment of the present invention, the measurement unit comprises an additional current source controlled by the control voltage and connected to the second output terminal.

BRIEF DESCRIPTION OF THE DRAWINGS

Features and advantages of one or more embodiments of the present invention will be discussed in detail in the following non-limiting description of specific embodiments in connection with the accompanying drawings.

DETAILED DESCRIPTION

Figure 1:
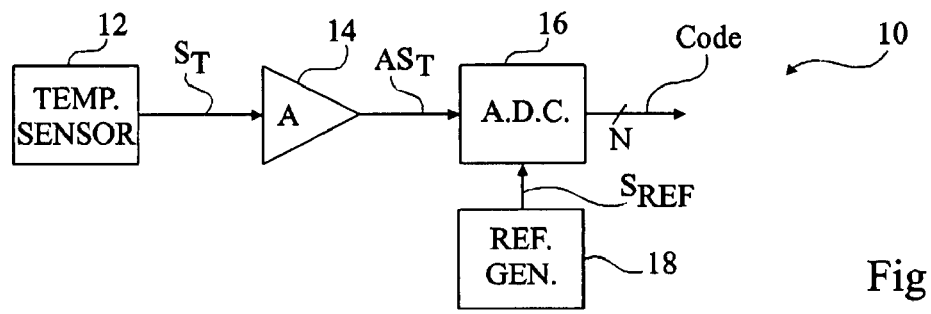
FIG. 1, previously described, shows a conventional embodiment of a temperature sensor.

For clarity, same elements have been designated with same reference numerals in the different drawings.

An embodiment of the present invention has been developed from the analysis of an analog-to-digital converter 16 having a specific structure.

Figure 2:
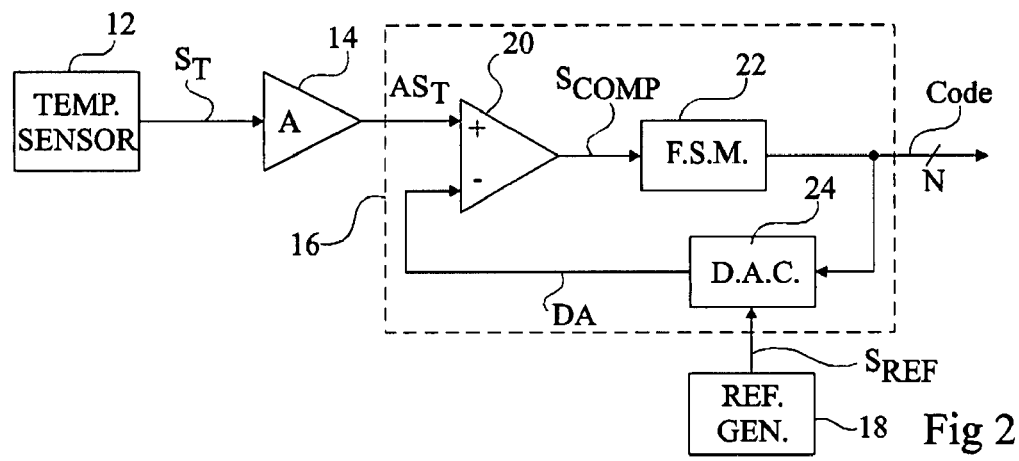
FIG. 2 shows another embodiment of a temperature sensor.

FIG. 2 shows a temperature sensor comprising a feedback-loop analog-to-digital converter 16 which comprises a comparator 20 receiving, on its positive input (+), amplified signal $AS_T$, and providing a binary signal $S_{COMP}$ to a coding unit 22, for example, a finite state machine (F.S.M.). Coding unit 22 provides binary signal Code corresponding to the digital conversion of signal $AS_T$. A digital-to-analog converter 24 (D.A.C.) receives digital signal Code and converts it into an analog signal DA provided to the negative input (−) of comparator 20. Reference signal $V_{REF}$ is provided to converter 24.

Analog-to-digital converter 16 may operate according to a method by piecewise approximation or by digital ramp. As an example, with the operating method by successive approximation, unit 22 initially provides a signal Code for which the most significant bit is at "1", the other bits being at "0", which thus corresponds to the median value likely to be coded by signal Code. According to the result of the comparison of signal DA, corresponding to the conversion of signal Code, and of signal $AS_T$, the most significant bit of signal Code is maintained at "1" or set to "0". The method is successively repeated for decreasingly significant bits down to the least significant bit. Signal Code finally obtained corresponds to the digital conversion of signal $AS_T$.

Calling $b_i$, i being an integer varying between 0 and N−1, the successive bits of signal Code, $b_{N-1}$ being the most significant bit, signal DA may be written as follows:

$$DA = \frac{DA_{FS}}{2^N - 1}(b_{N-1} \cdot 2^{N-1} + b_{N-2} \cdot 2^{N-2} + \ldots + b_1 \cdot 2^1 + b_0 \cdot 2^0) + DA_0 \quad (1)$$

where $DA_{FS}$ is the full scale swing of signal DA and $DA_0$ is the value of signal DA when all the bits of signal Code are at "0".

When the conversion method is over, signal DA complies with the following equation:

$$A \cdot S_T - DA = 0 \quad (2)$$

neglecting the remaining error, which is lower than the analog value corresponding to the least significant bit of signal Code.

Based on equations (1) and (2), the following equation is obtained:

$$b_{N-1} \cdot 2^{N-1} + b_{N-2} \cdot 2^{N-2} + \ldots + b_1 \cdot 2^1 + b_0 \cdot 2^0 = (2^N - 1)\frac{A \cdot S_T - DA_0}{DA_{FS}} \quad (3)$$

If signal $S_T$ is proportional to the absolute temperature, and if values $DA_0$ and $DA_{FS}$ are obtained from a reference signal independent from temperature, signal Code effectively is a linear digital representation of temperature.

Parameters $DA_{FS}$ and $DA_0$ may be set to enable the coding of a temperature T belonging to any temperature range $[T_0, T_1]$, where $T_0$ is the minimum operating temperature of the sensor and corresponds to the value of signal Code for which all bits are at "0", and where $T_1$ is the maximum operating temperature of the sensor and corresponds to the value of signal Code for which all bits are at "1". Indeed, signal $S_T$ being proportional to absolute temperature T, it may be expressed as follows:

$$A \cdot S_T = B \cdot T \quad (4)$$

where B is a constant term.

For the value of signal Code (0, . . . ,0), one has:

$$0 = (2^N - 1)\frac{B \cdot T_0 - DA_0}{DA_{FS}} \quad (5)$$

For the value of signal Code (1, . . . ,1), one has:

$$2^N - 1 = (2^N - 1)\frac{B \cdot T_1 - DA_0}{DA_{FS}} \quad (6)$$

Based on equations (5) and (6), the expressions of parameters $DA_{FS}$ and $DA_0$ are obtained as follows:

$$DA_0 = B \cdot T_0 \quad (7)$$

$$DA_{FS} = B \cdot (T_1 - T_0) \quad (8)$$

It is thus possible to arbitrarily select the operating temperature range of the sensor by setting the minimum value and the full-scale swing of digital-to-analog converter 24 based on equations (7) and (8).

Between temperatures $T_0$ and $T_1$, signal Code is obtained from the following equation:

$$b_{N-1} \cdot 2^{N-1} + \ldots + b_1 \cdot 2^1 + b_0 \cdot 2^0 = (2^N - 1)\frac{T - T_0}{T_1 - T_0} \qquad (9)$$

A potential disadvantage of such a converter 16 is that it may be difficult to simultaneously obtain an amplifier 14 and a digital-to-analog converter 24 which are simple to form. Indeed, assume that for $T_0$ equal to 233 K, $S_T$ is equal to 45 mV, and that for $T_1$ equal to 398 K, $S_T$ is equal to 75 mV. For an amplification factor A equal to 33, $DA_0$ is equal to 1.5 V and $DA_{FS}$ is equal to 2.5 V. Such an amplification factor A is in practice very difficult to obtain with the necessary accuracy: for example, a 1% error on this factor causes an error greater than 3 degrees Celsius. For an amplification factor A more easy to obtain, for example, equal to 10, $DA_0$ is equal to 0.45 V and $DA_{FS}$ is equal to 0.75 V. In this case, the values of parameters $DA_0$ and $DA_{FS}$ are difficult to obtain with accuracy.

Figure 3:
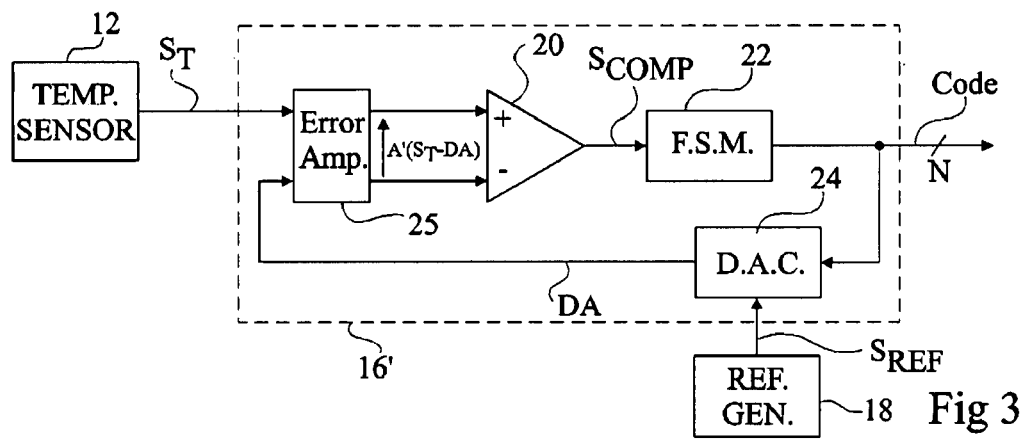
FIG. 3 shows a temperature sensor according to an embodiment of the present invention.

FIG. 3 shows a temperature sensor comprising an analog-to-digital converter 16' modified with respect to analog-to-digital converter 16 of FIG. 2. In particular, converter 16' comprises an error amplification unit 25 receiving signal $S_T$ and signal DA and providing a signal $A'(S_T-DA)$ across comparator 20. As compared with the sensor of FIG. 2, amplifier 14 is not present. Signal $A'(S_T-DA)$ corresponds to the difference between signals $S_T$ and DA, this difference being amplified by gain A'. With such a structure of converter 16', the difference between signals $S_T$ and DA is calculated before amplification. Gain A' is thus not necessarily accurate since only the sign of the difference between signals $S_T$ and DA matters. Thereby, typically only the offset introduced by amplification unit 25 can have an incidence on the decision of comparator 20.

However, a potential disadvantage of such a sensor is that the full scale swing of signal DA between the values corresponding to codes Code (0, . . . ,0) and Code (1, . . . ,1) must now correspond to the full scale swing of signal $S_T$, for example on the order of 30 mV. In practice, it may be difficult to form a digital-to-analog converter 24 providing a signal DA with such a full-scale swing.

An embodiment of the present invention is a specific implementation of the temperature sensor of FIG. 3 which enables getting rid of the previously-mentioned disadvantage.

Figure 4:
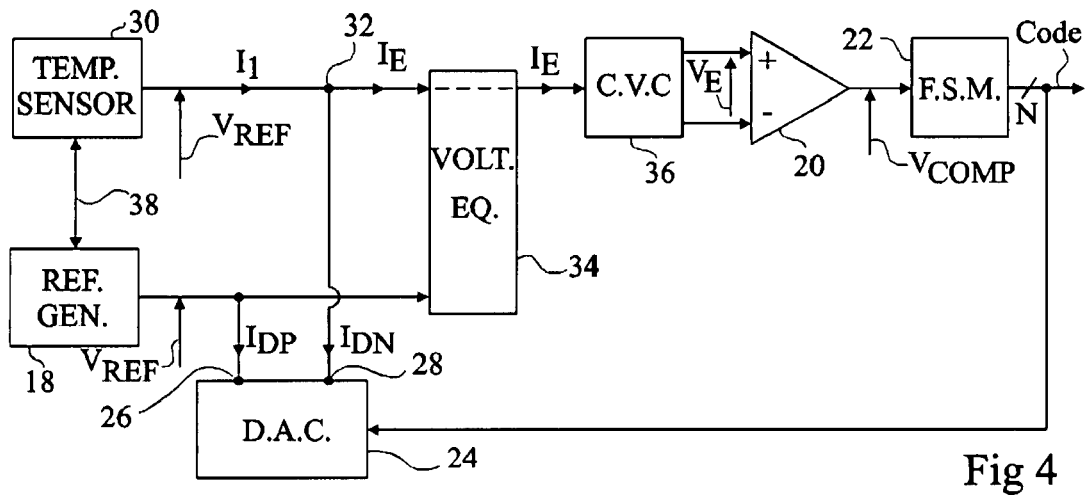
FIG. 4 shows a more detailed embodiment of the temperature sensor of FIG. 3.

FIG. 4 shows an embodiment of the temperature sensor according to the present invention in which digital-to-analog converter 24 is a current-switching converter, for example, a ladder network (R-2R converter). Converter 24 comprises an output terminal 26 receiving a current $I_{DP}$ and an output terminal 28 receiving a current $I_{DN}$.

Reference current generator 18 is connected to output terminal 26 to which it applies voltage $V_{REF}$. Temperature sensor 30 provides a current $I_1$ to a node 32 connected to output terminal 28 of converter 24 and to an input of a voltage equalizer 34 (VOLT.EQ.). Reference voltage $V_{REF}$ is also provided to voltage equalizer 34. Call $I_E$ the current flowing between node 32 and unit 34. Current $I_E$ is provided by unit 34 to a current-to-voltage converter 36 (C.V.C) which applies a voltage $V_E$ across comparator 20. A connection 38 is provided between temperature sensor 30 and reference voltage provision unit 18.

The operation of the present embodiment of the temperature sensor according to the present invention will now be described.

To ensure a proper operation of converter 24, the voltages at output terminals 26, 28 are maintained substantially constant and equal. Conventionally, the output terminals of a current-switching scale-network digital-to-analog converter are grounded. The present embodiment of the present invention provides an original biasing of converter 24 since output terminals 26, 28 of converter 24 are set to a constant voltage different from the ground voltage of the sensor. For this purpose, reference voltage generator 18 applies voltage $V_{REF}$ to terminal 26 and equalization unit 34 imposes voltage $V_{REF}$ on node 28.

Signal DA, provided by converter 24, is obtained by the following relation:

$$DA = I_{DN} - I_{DP} \qquad (10)$$

Temperature sensor 30 provides a current $I_1$ which is equal to the sum of a current $I_T$ proportional to the absolute temperature and of current $I_{DP}$. Node 32 plays the role of a subtractor. Current $I_E$ provided to voltage equalizer 34 is thus obtained by the following relation:

$$I_E = I_1 - I_{DN} = I_T + I_{DP} - I_{DN} = I_T - DA \qquad (11)$$

Voltage $V_E$ is proportional to current $I_E$ and is thus effectively proportional to the difference between signal $I_T$, proportional to the absolute temperature, and the analog conversion of digital signal Code coding current $I_T$. Current-to-voltage converter 36 simply has the function of ensuring that voltage $V_E$ and current $I_E$ are of same sign, the gain of converter 36 mattering little.

Figure 5:
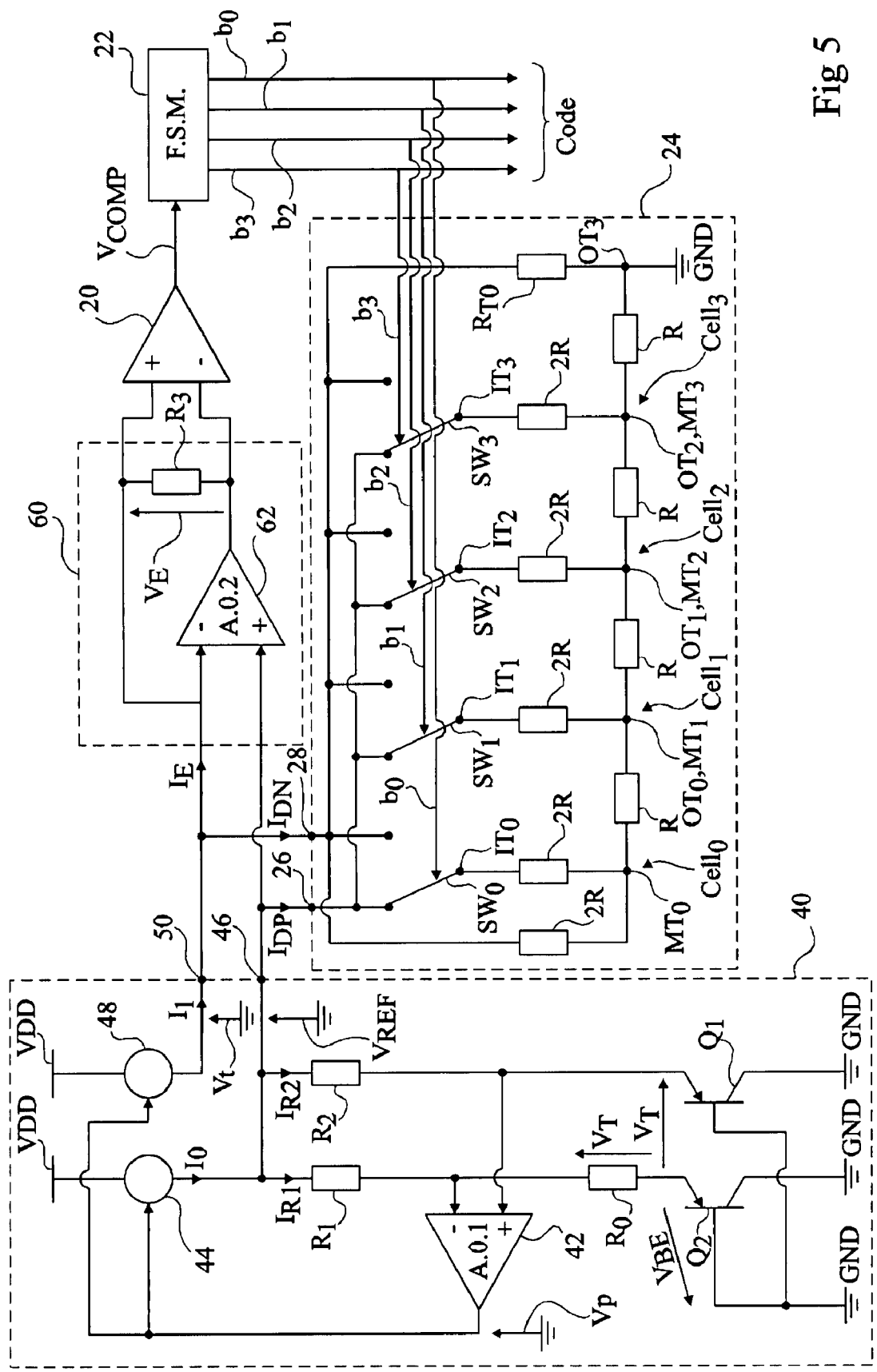
FIG. 5 shows a more detailed embodiment of the temperature sensor of FIG. 4.

FIG. 5 shows a more detailed embodiment of the temperature sensor of FIG. 4. According to the present detailed embodiment, the functions performed by temperature sensor 30 and reference voltage provision unit 18 are performed by a same circuit 40. Circuit 40 comprises a first bipolar transistor $Q_1$ having its collector and its base connected to a source of a low reference voltage GND, for example, the ground. The emitter of transistor $Q_1$ is connected to a positive terminal (+) of an operational amplifier 42 (A.O.1). Circuit 40 comprises a second bipolar transistor $Q_2$ having its collector and its base connected to ground GND. A resistor $R_0$ connects the emitter of transistor $Q_2$ to the negative input (−) of amplifier 42. Call $V_T$ the voltage between the emitter of transistor $Q_1$ and the emitter of transistor $Q_2$, and $V_p$ the voltage at the output of amplifier 42.

Circuit 40 comprises a voltage-controlled current source 44 which provide a current $I_0$. A terminal of current source 44 is connected to a high reference voltage source, for example, VDD, the other terminal of current source 44 being connected to a first output terminal 46 of circuit 40. Circuit 40 comprises a voltage-controlled current source 48, identical to current source 44 and providing a current $I_1$. A terminal of current source 48 is connected to power supply VDD, the other terminal of current source 48 being connected to a second output terminal 50 of circuit 40. Current sources 44, 48 are controlled by voltage $V_p$ provided by amplifier 42. A resistor $R_1$ connects the negative input (−) of amplifier 42 and output terminal 50. A resistor $R_2$ connects the positive input (+) of amplifier 42 and output terminal 46. Call $I_{R1}$ and $I_{R2}$ the currents respectively crossing resistors $R_1$ and $R_2$. Voltage $V_{REF}$ corresponds to the voltage on terminal 46. Call $V_t$ the voltage at terminal 50. Output terminal 50 is connected to output terminal 28 of converter 24 and output terminal 46 is connected to output terminal 26 of converter 24.

According to the present embodiment, the functions performed by voltage equalizer 34 and current-to-voltage conversion unit 36 are performed by a same circuit 60. Circuit 60 comprises an operational amplifier 62 (A.O.2) having its negative input (−) connected to output terminal 28 of converter 24 and having its positive input (+) connected to output terminal 26 of converter 24. The positive input of amplifier 62 is connected to a terminal of a resistor $R_3$ having its other terminal connected to the output of amplifier 62. Voltage $V_E$ across resistor $R_3$ is applied across comparator 20.

Converter 24 is of current-switching ladder network type. In the present embodiment, number N of bits of signal Code is equal to 4. Circuit 24 comprises a resistor $R_{T0}$ connected between ground GND and output terminal 28. Circuit 24 comprises a stacking of N cells. Each cell $Cell_i$, i being an integer ranging between 0 and N−1, comprises an input terminal $IT_i$, an intermediary terminal $MT_i$, and an output terminal $OT_i$, a resistor 2R connecting input terminal $IT_i$ to intermediary terminal $MT_i$ and a resistor R connecting intermediary terminal $MT_i$ to output terminal $OT_i$. Output terminal $OT_i$ of a cell $Cell_i$ is connected to intermediary terminal $MT_{i+1}$ of the adjacent cell $Cell_{i+1}$. Output terminal $OT_{N-1}$ of last cell $Cell_{N-1}$ is connected to ground GND. A resistor 2R connects input terminal $MT_0$ of first cell $Cell_0$ to output terminal 28 of converter 24. Each cell $Cell_i$ comprises a switch $SW_i$ controlled by bit $b_i$ of signal Code and capable of connecting input terminal $IT_i$ to terminal 26 or to output terminal 28 of converter 24 according to the value of bit $b_i$. As an example, when bit $b_i$ is at "1", switch $SW_i$ connects input terminal $IT_i$ of cell $Cell_i$ to output terminal 28 and when bit $b_i$ is at "0", switch $SW_i$ connects input terminal $IT_i$ of cell $Cell_i$ to output terminal 26. Transistor switches $SW_i$ may be formed by MOS transistors.

The operation of the present embodiment of the temperature sensor will now be described.

Calling h the ratio of the currents crossing the emitters of transistors $Q_1$ and $Q_2$ and m the ratio of the surface areas of the emitters of transistors $Q_1$ and $Q_2$, voltage $V_T$ is given by the following relation:

$$V_T = \lambda_T \cdot T = \frac{k \cdot T}{q} \ln(h \cdot m) \quad (12)$$

where k is Boltzmann's constant and where q is the charge of an electron. Voltage $V_T$ is thus proportional to the absolute temperature. Amplifier 42 controls current sources 44, 48 so that the voltage between its positive and negative inputs remains zero. The voltage across resistor $R_0$ is thus, in steady state, equal to $V_T$.

Further, voltage $V_{REF}$ at output terminal 46 is obtained by the following relation:

$$V_{REF} = \left(1 + \frac{R_1}{R_0}\right) \cdot V_T - V_{BE} \quad (13)$$

where $V_{BE}$ is the voltage between the base and the emitter of transistor $Q_2$. Voltage $V_{BE}$ is obtained by the following relation:

$$V_{BE} = V_{BE0} - \lambda_{BE} \cdot T - c(T) \quad (14)$$

where $V_{BE0}$ and $\lambda_{BE}$ are constant terms and c(T) is a second order term which depends on temperature.

One then has:

$$V_{REF} = -V_{BE0} + \left[\lambda_T\left(1 + \frac{R_1}{R_0}\right) + \lambda_{BE}\right] \cdot T + c(T) = \alpha + \beta \cdot T + c(T) \quad (15)$$

By adaptedly selecting resistances $R_1$ and $R_0$, coefficient β can be annulled and a voltage $V_{REF}$, which depends on temperature at the second order, that is, which is substantially independent from temperature, can be obtained.

Due to the regulation performed by amplifier 62, the voltage between the positive and negative inputs of amplifier 62 remains substantially zero. This enables ensuring that voltage $V_t$ at terminals 50 and 28 is permanently and substantially equal to $V_{REF}$. The maintaining of constant equal voltages at terminals 26 and 28 of converter 24 causes the good operation thereof.

Call $I_T$ the sum of currents $I_{R1}$ and $I_{R2}$. One has the following relation:

$$I_T = \left(1 + \frac{R_1}{R_2}\right) \cdot \frac{V_T}{R_0} \quad (16)$$

Voltage $V_T$ being proportional to the absolute temperature, current $I_T$ is itself proportional to the absolute temperature.

Currents sources 44 and 48 being identical and both controlled by voltage $V_P$, currents $I_1$ and $I_0$ are identical and provided by the following relation:

$$I_1 = I_0 = I_T + I_{DP} \quad (17)$$

Currents $I_{DP}$ and $I_{DN}$ are provided by the following relations:

$$I_{DP} = \frac{V_{REF}}{2R} \sum_{i=0}^{N-1} \overline{b_i} 2^{i-N} \quad (18)$$

and $$I_{DP} + I_{DN} = \left(\frac{1}{2R} + \frac{1}{R_{T0}}\right) \cdot V_{REF} \quad (19)$$

One thus obtains:

$$DA_{FS} = \frac{(1 - 2^{-N}) \cdot V_{REF}}{R} \quad (20)$$

$$DA_0 = \left(\frac{1}{R_{T0}} - \frac{1 - 2^{-N+1}}{2R}\right) \cdot V_{REF} \quad (21)$$

The fact of using difference $I_{DN} - I_{DP}$ as signal DAC rather than directly signal $I_{DP}$ enables doubling the full-scale swing of converter 24. Parameter $DA_{FS}$ can easily be modified by varying R and parameter $DA_0$ can easily be modified by varying $R_{T0}$. The resolution of the present embodiment of the sensor can easily be increased by providing additional cells at the level of digital-to-analog converter 24.

An embodiment of the present invention enables obtaining a temperature sensor comprising an analog-to-digital converter that can easily be made in integrated fashion. Further, the sensor comprises a decreased number of components and can thus be made in integrated fashion while taking up a decreased surface area and having a limited consumption. The present embodiment of the sensor limits sources of errors which might alter digital signal Code. Indeed, the reference voltage is directly applied across converter 24, which avoids any offset due to copying or intermediary storages of the reference voltage. Further, comparator 20 receives the voltage across resistor $R_3$, which enables getting rid, in the comparison, of the offset introduced by amplifier 62. Further, digital-to-analog converter 24 only comprises resistors and transistors that can easily be made with accuracy. Further, the accuracy of the signal provided by digital-to-analog converter 24 only depends at the first order on the resistors, since the transistors that it contains are used as switches and only intervene at the second order.

Of course, the present invention is likely to have various alterations, modifications, and improvements which will readily occur to those skilled in the art. In particular, coding unit 22 may be adapted to the selected analog-to-digital conversion method. As an example, for an analog-to-digital conversion with a digital ramp, coding unit 22 may comprise an AND gate receiving signal $V_{COMP}$ and a clock signal, the gate output driving a counter which provides signal Code.

The temperature sensor circuit of FIGS. 4 and 5 may be disposed on an integrated circuit (IC), which may be coupled to another circuit, such as a controller, to form a system. The IC and the other circuit may be disposed on the same die to form a system on a ship; or the IC and other circuit may be disposed on separate dies.

Such alterations, modifications, and improvements are intended to be part of this disclosure, and are intended to be within the spirit and the scope of the present invention. Accordingly, the foregoing description is by way of example only and is not intended to be limiting.

What is claimed is:

1. A temperature sensor providing a digital signal representative of temperature, comprising:
   a measurement unit providing a first measurement current equal to the sum of at least a first current proportional to temperature and of a second current;
   a comparator capable of providing a comparison signal which depends on the comparison between the first current and the difference between a third current and the second current;
   a coding unit receiving the comparison signal and providing said digital signal;
   a current-switching digital-to-analog converter capable of providing the second current to a first output terminal and the third current to a second output terminal, said difference corresponding to the conversion of said digital signal, the measurement unit being connected to the first output terminal; and
   a unit for providing a reference voltage to the first and second output terminals having a value distinct from the sensor ground voltage.

2. The sensor of claim 1, comprising a unit for providing said reference voltage to the first output terminal and a unit capable of applying the reference voltage to the second output terminal.

3. The sensor of claim 2, comprising a first operational amplifier having a first input connected to the first output terminal and a second input connected to the second output terminal, and a resistor connecting the second input and the output of the first operational amplifier, the comparator comprising a second operation amplifier having third and fourth inputs, the voltage across the resistor being applied between the third and fourth inputs of the second operational amplifier.

4. The sensor of claim 1, wherein the digital signal comprises an integral number N of bits of ranks 0 to N−1, the bit of rank N−1 being the most significant, and wherein the digital-to-analog converter is a ladder network comprising N successive cells, each comprising:
   an input node, an intermediary node, and an output node;
   a first resistor at a first resistance value between the input node and the intermediary node;
   a second resistor at a second resistance value between the intermediary node and the output node, the output node of a cell of rank i, where i is an integer ranging between 0 and N−2, being connected to the intermediary node of the cell of rank i+1; and
   a switch capable of connecting the input node to the first output terminal or to the second output terminal according to the value of the bit of rank i of said digital signal, and wherein the output node of the cell of rank N−1 is connected to the sensor ground, a third resistor at the first resistance value connecting the intermediary node of the cell of rank 0 to the second output terminal.

5. The sensor of claim 4, further comprising a fourth resistor connecting the output node of the cell of rank N−1 to the second output terminal.

6. The sensor of claim 1, wherein the unit for providing the reference voltage comprises:
   first and second bipolar transistors having their bases and collectors connected to the sensor ground;
   an operational amplifier having a first input connected to the first output terminal via a first resistor and to the emitter of the first transistor and a second input connected to the first output terminal via a second resistor and to the emitter of the second transistor via a third resistor, said operational amplifier providing a control voltage; and
   a current source controlled by the control voltage and connected to the first output terminal.

7. The sensor of claim 6, wherein the measurement unit comprises an additional current source controlled by the control voltage and connected to the second output terminal.

8. A circuit, comprising:
   first and second nodes;
   a digital-analog-converter operable to provide, in response to a first signal, respective second and third signals to the first and second nodes;
   a temperature sensor coupled to the first and second nodes and operable to generate a fourth signal that is proportional to temperature, and provide a fifth signal to the second node, the fifth signal substantially equal to a sum of the second and fourth signals; and
   a generator operable to generate the first signal in response to a difference between the third and fifth signals.

9. The circuit of claim 8, further comprising:
   a comparator circuit coupled to the first and second nodes and operable to generate a comparison signal having a value related to a polarity of the difference between the third and fifth signals; and
   wherein the generator generates the first signal in response to the comparison signal.

10. The circuit of claim 8 wherein the generator is operable to:
    change the first signal from a first value to a second value; and
    maintain the first signal at the second value if the third signal has a predetermined relationship to the fifth signal.

11. The circuit of claim 8 wherein the generator is operable to:
change the first signal from a first value to a second value; and
change the first signal from the second value to a third value if the third current has a predetermined relationship to the fifth current.

12. The circuit of claim 8 wherein:
the first signal comprise a digital signal; and
wherein the generator is operable to change a digit of the first signal from a first value to a second value;
maintain the digit at the second value if the third signal has a predetermined relationship to the fifth signal; and
change the digit back to the first value if the third signal does not have the predetermined relationship to the fifth signal.

13. The circuit of claim 8 wherein:
the first signal comprises a digital signal;
the digital signal has a number of digits;
the generator is operable to sequentially set each of the digits in response to the difference between the third and fifth signals; and
after the generator sets the digits, the digital signal has a value that represents a temperature measured by the temperature sensor.

14. The circuit of claim 8, further comprising an amplifier operable to maintain a voltage on the second node substantially equal to a voltage on the first node.

15. The circuit of claim 8 wherein:
the first signal comprises a digital signal; and
the second, third, fourth, and fifth signals respectively comprises second, third, fourth, and fifth currents.

16. An integrated circuit, comprising:
first and second nodes;
a digital-analog-converter operable to provide, in response to a first signal, respective second and third currents to the first and second nodes;
a temperature sensor coupled to the first and second nodes and operable to generate a fourth signal that is proportional to temperature, and provide a fifth signal to the second node, the fifth signal substantially equal to a sum of the second and fourth signals; and
a generator operable to generate the first signal in response to a difference between the third and fifth signals.

17. A system, comprising:
a first integrated circuit, comprising
first and second nodes,
a digital-analog-converter operable to provide, in response to a first signal, respective second and third signals to the first and second nodes,
a temperature sensor coupled to the first and second nodes and operable to generate a fourth signal that is proportional to temperature, and provide a fifth signal to the second node, the fifth signal substantially equal to a sum of the second and fourth signals, and
a generator operable to generate the first signal in response to a difference between the third and fifth signals; and
a second integrated circuit coupled to the first integrated circuit.

18. The system of claim 17 wherein the first and second integrated circuits are disposed on a same die.

19. The system of claim 17 wherein the first and second integrated circuits are respectively disposed on first and second dies.

20. The system of claim 17 wherein the second integrated circuit comprises a controller.

21. A method, comprising:
generating first and second signals in response to a code;
generating a third signal that is proportional to temperature; and
generating the code in response to a difference between the second signal and a fourth signal having a magnitude that is substantially equal to a combination of the magnitudes of the first and third signals.

22. The method of claim 21 wherein a sum of the first and second signals is substantially constant.

23. The method of claim 21 wherein the magnitude of the fourth signal is substantially equal to a sum of the magnitudes of the first and third signals.

24. The method of claim 21, further comprising:
wherein the first, second, third, and fourth signals comprise respective first, second, third, and fourth currents;
sinking the first and second currents from respective first and second nodes; and
sourcing the fourth current to the second node.

25. The method of claim 21, further comprising:
wherein the first, second, third, and fourth signals comprise respective first, second, third, and fourth currents;
sinking the first and second currents from respective first and second nodes;
sourcing the fourth current to the second node; and
maintaining a voltage difference between the first and second nodes at substantially zero.

26. The method of claim 21 wherein generating the value comprises:
changing a digit of the code from a first value to a second value;
changing the digit from the second value to the first value if the difference between the second and fourth signals has a first polarity;
maintaining the digit at the second value if the difference between the second and fourth signals has a second polarity opposite to the first polarity; and
repeating changing, changing, and maintaining for each digit of the code.

27. The method of claim 21 wherein the code represents the temperature.

28. The method of clam 21 wherein generating the first and second signals comprises generating the first and second signals with a digital-to-analog converter.

* * * * *